(12) United States Patent
Jardel et al.

(10) Patent No.: US 10,038,441 B2
(45) Date of Patent: Jul. 31, 2018

(54) POWER SWITCHING CELL WITH NORMALLY CONDUCTING FIELD-EFFECT TRANSISTORS

(71) Applicants: THALES, Courbevoie (FR); COMMISSARIAT A L'ENERGIE ATOMIQUE ET AUX ENERGIES ALTERNATIVES, Paris (FR); UNIVERSITE DE LIMOGES, Limoges (FR); CENTRE NATIONAL DE LA RECHERCHE SCIENTIFIQUE, Paris (FR)

(72) Inventors: Olivier Jardel, Palaiseau (FR); Raymond Quere, Saint Pantaleon de Larche (FR); Stéphane Piotrowicz, Magny les Hameaux (FR); Philippe Bouysse, Vicq-sur-Breuilh (FR); Sylvain Delage, Orsay (FR); Audrey Martin, Rilhac-Rancon (FR)

(73) Assignees: THALES, Courbevoie (FR); COMMISSARIAT A L'ENERGIE ATOMIQUE ET AUX ENERGIES ALTERNATIVES, Paris (FR); UNIVERSITE DE LIMOGES, Limoges (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/306,027

(22) PCT Filed: Apr. 17, 2015

(86) PCT No.: PCT/EP2015/058410
§ 371 (c)(1),
(2) Date: Oct. 21, 2016

(87) PCT Pub. No.: WO2015/162063
PCT Pub. Date: Oct. 29, 2015

(65) Prior Publication Data
US 2017/0047924 A1 Feb. 16, 2017

(30) Foreign Application Priority Data

Apr. 22, 2014 (FR) .................................. 14 00948

(51) Int. Cl.
*H03B 1/00* (2006.01)
*H03K 3/00* (2006.01)
(Continued)

(52) U.S. Cl.
CPC ..... *H03K 17/687* (2013.01); *H03K 17/04106* (2013.01); *H03K 19/09407* (2013.01)

(58) Field of Classification Search
CPC ................. H03K 17/04; H03K 17/041; H03K 17/04106; H03K 17/51; H03K 17/56;
(Continued)

(56) References Cited

U.S. PATENT DOCUMENTS

| 5,278,422 A | 1/1994 | Kato et al. |
| 5,514,996 A | 5/1996 | Aizawa |

(Continued)

FOREIGN PATENT DOCUMENTS

| JP | S62-296617 A | 12/1987 |
| WO | 2012/072503 A1 | 6/2012 |

*Primary Examiner* — Lincoln Donovan
*Assistant Examiner* — Diana J Cheng
(74) *Attorney, Agent, or Firm* — Baker & Hostetler LLP

(57) ABSTRACT

A power switching cell with normally on field-effect transistors comprises a current switch receiving the control input signal over an activation input and a power transistor for switching a high voltage $V_{DD}$ applied to its drain, to its source that is connected to the output port of the cell. The control of the gate of the power transistor whose source is floating, according to the input signal, is provided by a (Continued)

self-biasing circuit connected between its gate and source. The current switch is connected between the self-biasing circuit and a zero or negative reference voltage. The self-biasing circuit comprises a transistor whose source or drain is connected to the gate or source of the power transistor. The gate of this transistor is biased by a resistor connected between its gate and source, and between the current switch and the source. The transistors are HEMT transistors using GaN or AsGa technology.

10 Claims, 4 Drawing Sheets

(51) Int. Cl.
*H03K 17/687* (2006.01)
*H03K 19/094* (2006.01)
*H03K 17/041* (2006.01)

(58) Field of Classification Search
CPC .............. H03K 17/687; H03K 17/6871; H03K 17/6877; H03K 19/02; H03K 19/08; H03K 19/094; H03K 19/09403; H03K 19/09407
USPC .................................................. 327/108–112
See application file for complete search history.

(56) References Cited

U.S. PATENT DOCUMENTS

| | | | | |
|---|---|---|---|---|
| 7,782,099 B2* | 8/2010 | Kawamura | .......... | H03K 17/302 327/108 |
| 8,467,239 B2* | 6/2013 | Kalb | ................. | G11C 13/0004 365/148 |
| 8,558,587 B2* | 10/2013 | Machida | ................. | H02M 1/08 327/109 |
| 9,553,510 B2* | 1/2017 | Tsukiji | ................. | H02M 3/156 |

* cited by examiner

PRIOR ART

POWER SWITCHING CELL WITH NORMALLY CONDUCTING FIELD-EFFECT TRANSISTORS

CROSS-REFERENCE TO RELATED APPLICATIONS

This application is a National Stage of International patent application PCT/EP2015/058410, filed on Apr. 17, 2015, which claims priority to foreign French patent application No. FR 1400948, filed on Apr. 22, 2014, the disclosures of which are incorporated by reference in their entirety.

FIELD OF THE INVENTION

The invention relates to power switching and, more particularly, power switching for radiofrequency applications. The field of application of the invention is particularly that of radar or wireless telecommunications systems.

BACKGROUND

Telecommunications RF signals carry ever more information, coded by virtue of various types of modulation (OFDM, 16-QAM, etc.) that cause, in particular, large and rapid variations in their envelopes. Given the low electrical efficiencies of conventional RF amplifiers for amplifying these signals exhibiting complex modulations, various amplifier architectures have been proposed and developed that allow better electrical efficiencies of amplification to be obtained and a good level of linearity to be retained.

One technique for improving the electrical efficiency of amplification consists particularly of dynamically managing the polarization of a radiofrequency amplifier according to the variations in the envelope of the signal to be amplified. "Indeed, envelope tracking" is spoken of in the technical literature.

Systems based on this principle are composed, inter alia, of voltage modulators, themselves composed of switched-mode power supplies, whose passband bandwidth must be at least as wide as that of the envelope of the RF signals to be amplified.

A key element in these switched-mode power supplies is the power switching cell, which allows a power signal to be switched at its output according to a low-power control signal applied to its input. In the field of interest, the power switching cell must, more particularly, satisfy two criteria: high switching speed and low electrical consumption.

In order to meet these needs, transistors referred to as RF transistors (i.e. generally used for RF or microwave frequency applications) may be used. High-electron-mobility transistors (HEMTs), in particular HEMTs using GaN (gallium nitride) technology, are suitable for these types of applications in that they are capable of conducting large currents at high voltages (conferring thereon properties favorable for use in power circuits) while exhibiting intrinsic parasitic capacitances that are low with respect to other technologies (allowing them to have high switching speeds). Constructional Difficulties and Particularities of Fast Modulators One of the main difficulties in producing high-speed switching circuits resides in achieving control of power transistors whose source potential is floating, i.e. not referenced to a fixed potential (generally ground): it varies between a potential close to zero and a potential corresponding to the level of the high voltage to be switched. Techniques for isolating the gate control by virtue of optocouplers or isolation transformers do not appear to be suitable for these high-frequency switching applications due to their relative slowness. Optocoupler switching cells and associated problems are, for example, described in documents U.S. Pat. No. 5,514,996 A and JPS62296617A. Furthermore, a notable particularity of many RF field-effect transistors and, in particular, of most GaN HEMTs, is that they exhibit a "depletion" operating mode. This means that their (N-type) channel is open when the voltage applied between their gate and their source is zero. Under these conditions, if the voltage between drain and source is non-zero, a non-zero current may flow between drain and source. In order to turn off such a transistor, it is necessary to deplete its channel of free charges, which is achieved by applying a negative gate-source voltage that is lower than or equal to the voltage referred to as the transistor pinch-off voltage, denoted by Vp (this voltage Vp is therefore negative). "Normally on" transistors are spoken of in the technical literature. The use of normally on transistors, even though they pose no particular difficulty, is not common for switching applications and requires the known architectures to be adapted to this specificity.

The gate bias control of a power transistor must thus be designed to both:

be suited to the normally on specificity of numerous RF field-effect transistors; and allow high-speed switching, without risking transistor breakdown, i.e. with a gate voltage that varies in a well-controlled manner with respect to the floating source voltage.

Furthermore, electrical losses from the switch must be as low as possible:

by switching (passing from the ON state to the OFF state and from the OFF state to the ON state) as rapidly as possible in order to limit switching losses, which is made possible by the choice of technology of components and by producing a suitable gate control circuit;

by limiting conduction losses: by choosing transistors having the lowest possible resistances in the on state, and by limiting their output leakage currents in the off state, when their maximum output voltage is close to the supply voltage.

DESCRIPTION OF A CELL OF THE PRIOR ART

It is in this context that the international patent application, published under the number WO2012/072503 A1, proposed a high-frequency power switching cell based on normally on field-effect transistors, with non-isolated control, taking an innovative approach to the control of the gate bias of the power transistor. Its basic structure and operation will briefly be described here, for the purposes of presenting the invention. Greater detail will be found in the text and drawings of the aforementioned application.

The basic structure of the cell of the solution of the prior art is schematically illustrated in FIG. 1. It comprises:

an input port In that receives an input signal $V_{IN}$ referenced with respect to the general ground of the cell Gnd (0 volts) and which controls the switching of the cell to the ON or OFF state;

an input transistor $T_1$ whose gate $g_1$ is connected to the input port In of the cell and whose source is referenced to the electrical ground Gnd (0 volts);

a normally on power transistor $T_2$ whose drain $d_2$ receives the positive supply voltage $V_{DD}$ in order to apply it to the output port Out of the cell, the source $s_2$ of this transistor being connected to the output port Out;

a resistor $R_1$ which is connected in series between the drain $d_1$ of the transistor $T_1$ and the gate $g_2$ of the transistor $T_2$; and a resistor $R_2$, referred to as a self-biasing resistor for biasing the power transistor $T_2$, which is connected between the gate $g_2$ and the source $s_2$ of this transistor.

The output port Out is linked to a downstream circuit, for example a purely resistive load $R_L$, to which the cell delivers the output power signal defined by an output voltage $V_{OUT}$ and an output current $I_{OUT}$.

In this example, the transistor $T_1$ is also of the normally on type.

This cell operates as follows: as the source of the transistor $T_1$ is referenced to the general ground of the cell GND (0 volts), the gate-source voltage of the transistor $T_1$ is equal to the voltage $V_{IN}$ applied to the control input. This voltage $V_{IN}$ typically varies between a high value, 0 volts or +1 volts for example, in order to switch the transistor $T_1$ to the ON state, and a negative value, lower than or equal to the pinch-off voltage of the transistor ($V_{IN} \le Vp$), in order to switch the transistor $T_1$ to the OFF state.

The high-frequency switching of the field-effect power transistor $T_2$ from an ON state to an OFF state, and vice versa, according to the input signal is ensured by means of the self-biasing resistor $R_2$. This resistor $R_2$ allows the bias voltage of the gate $g_2$ of the power transistor to be controlled:

according to the ON or OFF state of the transistor $T_1$, the resistor $R_2$ being connected to the drain $d_1$ of the transistor $T_1$ by the resistor $R_1$; and at a level that establishes itself with respect to the effective voltage of the floating source $s_2$ of the power transistor.

More specifically:

when the cell is switched to the ON state, the voltage $V_{IN}$ is lower than or equal to Vp, resulting in $T_1$ being switched off, which then ideally behaves as an open circuit. The current through $R_2$ is therefore zero, leading to a zero voltage across the terminals of $R_2$ and therefore a voltage $Vgs_2$ which is also zero. The transistor $T_2$ is then in the ON state, and the output voltage becomes equal to $V_{DD}$.

when the cell is switched to the OFF state, the voltage $V_{IN}$ takes a value that allows $T_1$ to be turned on (e.g. $V_{IN}$ equals 0 V, or else +1 volts). $T_1$ may then ideally be considered to be a closed switch. A current through $R_2$ may therefore be set up, and thus the voltage across the terminals of $R_2$ is non-zero. In this scenario, the current through $R_2$ that is set up is balanced so as to place the transistor $T_2$ in a state very close to pinch-off ($Vgs_2$ very slightly higher than Vp), via a counter-reaction effect. Specifically, if the current $Ids_2$ is too large, then the current through $R_2$ will also be too large and the voltage $Vds_2$ will also be too high, requiring the closure of $T_2$ and therefore leading to a decrease in the current $Ids_2$. If the current $Ids_2$ is too small, the value of $Vds_2$ will be too low, thus opening $T_2$ and increasing its current $Ids_2$. Self-biasing of the transistor $T_2$ by the self-biasing resistor $R_2$ is therefore obtained.

For the self-biasing branch to operate, the current $I_2$ may not be zero, which assumes that the transistor $T_2$ still allows a bit of current to flow between its drain and its source. Stated otherwise, the power transistor $T_2$ is not completely switched to the OFF state, but rather to the turn-off limit. Because of this non-completely zero drain-source current, the voltage $V_{out}$ at output Out will not be entirely zero either when the cell is switched to the OFF state.

Advantages/Drawbacks of the Cell of the Prior Art

This cell has various advantages, as explained in detail in the aforementioned application. In particular, the switching speed is improved, as a very small variation in the input voltage, of the order of a few millivolts in the vicinity of a threshold that depends on the two values of the resistors $R_1$ and $R_2$, is sufficient to obtain the transition of the cell. As a result, the control signal applied as input does not require precise shaping. The control logic is thereby simplified.

However, this cell necessitates a compromise between switching speed and electrical losses. Specifically, the self-biasing resistor $R_2$ must respond to two contradictory constraints:

it is desirable for the value of this resistor $R_2$ to be as high as possible when the power transistor $T_2$ is in the OFF state. Specifically, in this OFF state, the source voltage of the power transistor is close to zero, without actually being zero. The higher the value of the resistor $R_2$, the further the source voltage is pulled toward zero: consumption in the OFF state of the power transistor will be correspondingly lower.

it is desirable for the value of this resistor $R_2$ to be as low as possible in order to favor high-speed switching of the transistor from the OFF state to the ON state; specifically, high-frequency switching is sought. In this instance it involves minimizing the time constant $\tau = C_{in2} * R_2$ associated with the charge of the input capacitance $C_{in2}$ of the transistor $T_2$, inherent to its technology. The input capacitance encompasses the gate-source capacitance of the transistor and the parasitic capacitances on the gate due to the Miller effect.

The effects linked to these two constraints appear clearly in FIGS. 2 to 4 which show the drain-source voltage ($V_{ds2}$) and current ($I_{ds2}$) curves of the transistor $T_2$ as a function of time, obtained for various self-biasing resistor $R_2$ values. The current curves are here shown as dotted lines and the voltage curves as continuous lines.

These curves are obtained by simulating a cell such as shown in FIG. 1, based on models of HEMT transistors employing GaN (gallium nitride) technology.

The conditions of simulation of this cell were the following:

a) the transistors $T_1$ and $T_2$ are GaN RF HEMT transistors; their transition frequency is higher than 10 gigahertz; their pinch-off voltage Vp is of the order of −3.5 volts.

b) the power transistor $T_2$ has a total spread that is eight times greater than that of $T_1$. More specifically, $T_2$ is formed by a block of eight transistors each having a total gate spread of 6×400 µm; $T_1$ is a transistor exhibiting a total gate spread of 6×400 µm.

c) the logic signal $V_{IN}$ applied to the input port In has a duty cycle of 50% and a chopping frequency of 100 MHz. It varies between 0 volts and −4.5 volts.

d) the simulated load at the output Out is purely resistive, with a value of 16 ohms.

e) the high voltage $V_{DD}$ is equal to 50 volts.

By choosing $R_2=10$ ohms, the current and voltage curves illustrated in FIG. 2 are obtained. The switching time $t_{(ON \to OFF)}$ of the transistor $T_2$ from the ON state ($Vds_2=0$ volts) to the OFF state ($Vds_2$ is close to $V_{DD}$) is rapid, less than a nanosecond. It is seen that the transistor $T_2$ in the OFF state is not completely off and allows a drain-source current $Ids_2$ of the order of 1.13 amps to pass. The level of the drain-source voltage $Vds_2$ in the OFF state is lower than 40 volts. Thus, if the transistor $T_2$ quickly switches from the ON state to the OFF state, electrical losses in the OFF state are actually increased. The total efficiency calculated for the cell under the conditions of the simulation is 75%.

The choice of a markedly higher value of $R_2$, in the example illustrated in FIG. 3, of 100 ohms in fact favours low electrical losses in the OFF state, with a very small drain-source current $Ids_2$ in the OFF state of the order of 100 milliamps. The level of the drain-source voltage $Vds_2$ in the OFF state is close to $V_{DD}$. However, the switching time $t_{(ON \to OFF)}$ is much increased and is about 10 nanoseconds: the time constant linked to the input capacitance of the power transistor is too large. The total efficiency calculated for this cell under the conditions of the simulation is 70%.

FIG. 4 shows what is obtained with a self-biasing resistor $R_2$ value optimized for this cell in order to attempt to satisfy both constraints: short switching time and minimized electrical losses in the OFF state. In the example, this optimized value $R_2$ is equal to 18 ohms. The switching time is then of the order of 1 nanosecond and the drain-source current $Ids_2$ in the OFF state remains below 1 amp, 800 milliamps to be precise. The level of the drain-source voltage $Vds_2$ in the OFF state is around 40 volts. The total efficiency of the cell goes up to 77% for an output power of 75 watts at the chopping frequency of 100 MHz.

In any case, electrical losses caused by the drain-source current in the OFF state of the transistor $T_2$ decrease the efficiency of the cell, which is at most 77% under the conditions of simulation detailed above. Additionally, these losses contribute to adversely affecting the working life of the power transistor of these cells.

Thus, as very clearly shown in these figures, a problem with this cell structure is the necessary compromise to be struck between switching speed and electrical losses, through the choice of the value of the self-biasing resistor.

The switched-mode power supplies used in the polarization modulators in envelope tracking applications must usually have efficiencies of greater than 85% for the solution to provide an overall improvement to the efficiency of the system, and this must be achieved at switching frequencies of many, or many tens, of MHz. The cell described above has proven to be ill-suited to this type of application, using currently available transistor technologies.

SUMMARY OF THE INVENTION

A subject of the invention is a power switching cell with non-isolated control, based on normally on field-effect transistors, which does not have the aforementioned drawbacks.

In the invention it has been sought to manage, in the most efficient manner, the control of the gate bias of a normally on field-effect transistor used in a power switching circuit and whose source is floating.

The authors have been able to show that it is possible, for the most part, to be free from the compromise between the time taken to switch from the ON state to the OFF state and the value of the residual current in the OFF state, thus allowing greater operational efficiencies of the cell to be obtained. For this, the self-biasing resistor $R_2$ is replaced by a switching device composed of a transistor whose behavior resembles that of a variable resistor.

This normally on self-biasing transistor has the advantage of being controlled by the same transistor as the power transistor $T_2$, allowing simplicity of control of the cell to be maintained.

In a simplified manner, in the OFF state of the power transistor, the self-biasing transistor according to the invention is in the OFF state and equates to a high-value resistor, favorable to a decrease in electrical losses from the cell in the OFF state; while the power transistor is being switched, the self-biasing transistor according to the invention rapidly switches to the ON state and equates to a very low-value resistor, favorable to very high-speed switching of the power transistor.

This self-biasing transistor also has a floating source. It is advantageously and efficiently controlled by a self-biasing resistor connected between its source and its gate, as taught by the cell of the prior art, with the difference that this transistor is not the power transistor itself, but rather a self-biasing transistor that serves to control the gate bias of the power transistor.

The modification of the circuit produced by replacing a fixed-value resistor by a self-biased transistor allows its operation to be optimized by removing the need to compromise on the value of this resistor: high for decreasing losses in the OFF state, low for decreasing losses when switching.

Once the circuit has been well adjusted, with a judicious choice of components and their values, the transistor behaves as a variable resistor whose value is low while the main transistor is being switched and high in the OFF state. Electrical losses may be further decreased by choosing to reference the source of the input transistor to a negative reference potential.

The invention therefore relates to a power switching cell comprising:
  an input port capable of receiving a switching control signal which is referenced to a general ground of the cell, constituting a non-isolated control of the cell;
  a normally on field-effect power transistor whose drain is capable of receiving a positive supply voltage that is defined with respect to a ground at zero reference potential in order to apply it to an output port, the source of the power transistor being connected to the output port;
  a self-biasing circuit for biasing the gate of the power transistor;
  a current switch electrically connected between the self-biasing circuit and a negative or zero reference potential, of which one control input of the switch is connected to the input port, and configured so that, on activation by said switching control signal, it electrically connects the negative or zero reference potential to the self-biasing circuit.

The self-biasing circuit comprises:
  a normally on field-effect transistor whose drain is connected to the source of the power transistor and whose source is connected to the gate of the power transistor;
  a self-biasing resistor for biasing the gate of the transistor of the self-biasing circuit, which resistor is connected between the gate and the source of said self-biasing transistor; and in series between the current switch and the source of said self-biasing transistor.

The cell may comprise an adjustable current source connected in series between the current switch and the negative or zero reference voltage.

According to one aspect of the invention, the current switch is a field-effect transistor, in particular a normally on field-effect transistor.

The current switching controlled by activation of the current switch by the input logic signal causes the switching to the OFF state, a state that is at the turn-off limit, of the self-biasing transistor and of the power transistor; the deactivation of the current switch causes the switching to the ON state of the self-biasing transistor and of the power transistor.

The self-biasing transistor and the power transistor are preferably HEMT field-effect transistors. They are preferably produced using GaN or GaAs technology.

Certain connections in the cell may be made resistive by adding resistors, allowing fine adjustments to the structure of the cell with a view to improving its efficiency according to the operating conditions of use.

The invention also relates to an electronic device comprising a plurality of power switching cells in parallel, connected in common to one and the same output port.

BRIEF DESCRIPTION OF THE DRAWINGS

Other features and advantages of the invention are described in the following detailed description, given by way of indication and with reference to the appended drawings in which.

the three

DETAILED DESCRIPTION OF THE INVENTION

Figure 5:
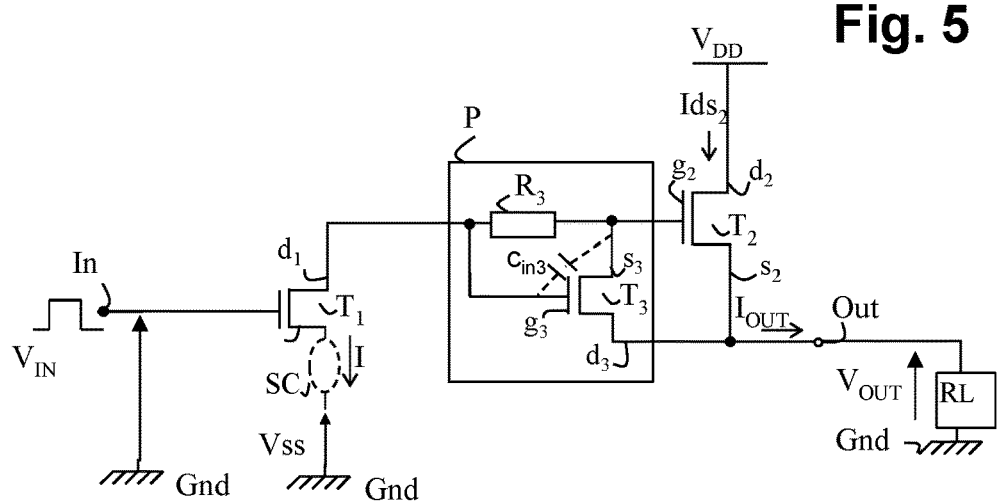
FIG. 5 illustrates an improved power switching cell structure according to the invention.

A basic structure of a cell according to the invention is illustrated in FIG. 5. For the sake of simplicity, the elements common to the cell of the prior art that is illustrated in FIGS. 1 to 4 and to the cell of the invention illustrated in FIGS. 5 to 13 bear the same references. The self-biasing and power transistors of the cell are normally on (ON state) field-effect transistors, even if this is not necessarily specified for the purpose of not overburdening the disclosure.

Figure 1:
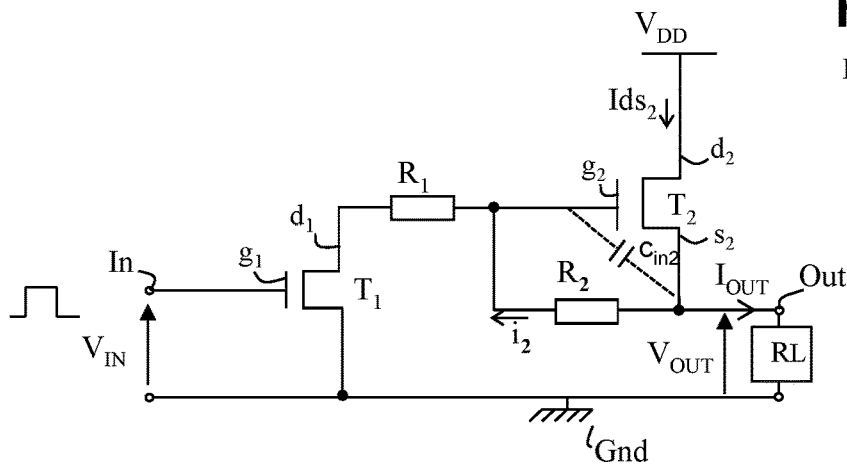
FIG. 1, already described, illustrates a basic structure of a power switching cell of the prior art using a self-biasing resistor for biasing the gate of the power transistor.

The basic structure of a cell according to the invention illustrated in FIG. 5 shares the current switch formed by the input transistor $T_1$ and the power transistor $T_2$ that switches the high voltage $V_{dd}$ with the cell of the prior art illustrated in FIG. 1.

The self-biasing resistor $R_2$ for biasing the gate of the power transistor of the cell of FIG. 1 is replaced, in the cell according to the invention, by a self-biasing circuit P for biasing the gate comprising:

a transistor $T_3$ that is a normally on field-effect transistor, connected as follows: its drain $d_3$ is connected to the source $s_2$ of the power transistor $T_2$ and hence to the output pad Out of the cell; its source $s_3$ is connected to the gate $g_2$; its gate $g_3$ is connected to the resistor $R_3$; and a self-biasing resistor $R_3$ for biasing the gate $g_3$ of the transistor $T_3$, connected between this gate $g_3$ and the source $s_3$ of the transistor $T_3$, and in series with the drain of the first transistor $T_1$.

The resistor $R_1$ on the drain of the transistor $T_1$, present in the cell of the prior art, is not shown here. It is optional.

The assembly formed by the self-biasing circuit P and the power transistor $T_2$ constitutes the load of the input transistor $T_1$, which load is thus placed in series between the drain $d_1$ of the transistor $T_1$ and the positive supply voltage $V_{DD}$.

It should be noted that in this structure, the transistor $T_3$ is like the transistor $T_2$; it is a floating-source transistor in the sense that its source $s_3$ is not referenced to a fixed potential: it follows the gate voltage of the power transistor $T_2$.

It should also be noted that although in the example the current switch is formed from one transistor $T_1$, it could comprise multiples thereof, for example in order to form a differential pair.

The operation of a cell according to the invention will now be explained by supposing a purely resistive output load denoted by $R_L$.

The cell has two stable states, the ON and OFF states:
the cell is said to be in the ON state when the transistors $T_2$ and $T_3$ are on (ON state), and the structure delivers power to the load;
the cell is said to be in the OFF state when the transistors $T_2$ and $T_3$ are at the turn-off limit (OFF state), and the load is isolated from the main power supply.

The transistors $T_3$ and $T_2$ are switched to the ON or OFF state according to the control signal $V_{IN}$ applied as input In to the cell, and which controls the ON or OFF state of the transistor $T_1$.

As detailed below, the transistor $T_1$ is a current switch. It is activated in order to switch a current toward the load formed by the self-biasing circuit P and the power transistor, and to switch the cell to the OFF state. The current switched by $T_1$ is small in comparison to the current switched by the main transistor. Thus, although the transistor $T_1$ may be chosen to be of the same technology and the same type as the transistors $T_2$ and $T_3$, i.e. normally on HEMT field-effect transistors, it could also be of a different technology (e.g. MOS) or conduction type. Hereinafter, and in particular in the exemplary simulations which are explained, the three transistors have been chosen to be of the same technology, HEMT, and to be normally on, thus advantageously allowing said circuit to be produced on monolithic chips (MMICs) in order to benefit from their advantages in terms of integration and decrease in parasitic wiring elements.

Operation in OFF State

When the transistor $T_1$ is in the ON state (e.g. $V_{IN}=Vss=0$ volt), the transistors $T_2$ and $T_3$ self-bias supposing a cell with elements judiciously chosen in order to allow the correct operation thereof so that both are in a state close to pinch-off (turn-off limit).

Supposing a simple ideal model for the transistors $T_2$ and $T_3$ of the form:

$Ids_i = Gm_i \cdot (Vgs_i - Vp)$.

(where $Ids_i$, $Gm_i$, and $Vgs_i$ are the usual notations for the drain-source current, the transconductance and the gate-source voltage of a transistor $T_i$ (i=1 or 2), respectively. Vp is the pinch-off voltage, which is the same for both transistors, and depends on the technology).

Then it is shown that the gate-source voltage of the transistor $T_2$ in the OFF state, denoted by $Vgs_{2\_OFF}$, est given by the following equation EQ1:

$$Vgs_{2\_OFF} = \left[ \frac{R_L \cdot Gm_2 - 1 - Vss}{R_L \cdot Gm_2 + 1} - \frac{Gm_3 \cdot (R_3 + R_L)}{(R_L \cdot Gm_2 + 1) \cdot (R_3 \cdot Gm_3 + 1)} \right] \cdot Vp$$

This shows that the value of the gate-source voltage of $T_2$ in its near pinch-off state may be adjusted to a value very close to $-V_p$ through a judicious choice of elements and voltage values, and in particular through an appropriate choice of values of $R_3$ and Vss. The drain current in the OFF state of the transistor $T_2$ may thus be limited to very low values.

By referencing the source of $T_1$ to ground (Vss=0 volt), it may be shown that with an optimal choice of elements of the cell, the drain current in the OFF state of the transistor $T_2$ is substantially smaller than that obtained in the case of a cell of the prior art, presented in the introduction. Thus, replacing only the self-biasing resistor $R_2$ of the cell of the prior art with the proposed self-biasing circuit is already advantageous in itself.

By referencing the source of the transistor $T_1$ to a more negative voltage Vss (and no longer to ground), for example to −6.5 volts, this makes it possible to more closely approach the gate-source voltage in the OFF state of the transistor $T_2$ $Vgs_{2\_OFF}$, hence to further decrease the drain current in the OFF state of the transistor $T_2$, and therefore to further improve the efficiency of the cell. This solution is therefore advantageous, as will be shown below with reference to FIGS. 8 to 12.

As mentioned above, the transistor $T_1$ is a current switch. The current I switched by the transistor $T_1$ controls the operating point of the transistor $T_3$ of the self-biasing circuit P: this current I effectively fixes the gate-source voltage $Vgs_3$, $Vgs_3=I \cdot R_3$, and the drain-source current $Ids_3$, $Ids_3=I$, of the transistor $T_3$. A determined drain-source voltage value $Vds_3$ of the transistor $T_3$ corresponds to this operating point. In terms of construction, the drain-source voltage of the transistor $T_3$ is equal to the gate-source voltage $Vgs_2$ of the transistor $T_2$. Thus, the transistor $T_1$, switched to the ON state, makes it possible for the gate-source voltage of the power switching transistor $T_2$ to be current-controlled in the OFF state ($Vgs_{2\_OFF}$).

This is indirect control, since the current I, switched by the transistor $T_1$, is in fact delivered by the structure of the cell. The values of the current I and of the voltage $Vgs_{2\_OFF}$ are thus not directly adjustable. They are adjusted indirectly, through appropriate sizing of the structure of the cell and, in particular, through an appropriate choice of values of the resistor $R_3$ and of the voltage Vss, as shown by the equation EQ1.

It should be noted that provision may be made to connect an adjustable current source (transistor, current mirror, etc.) in series between the current switch formed by the transistor $T_1$ and ground Vss (cf. FIG. 5, current source SC represented in dotted lines). The current I delivered by the current source SC and switched by the transistor $T_1$ is then directly adjustable to an appropriate value, which allows a voltage $Vgs_{2\_OFF}$ that is very close to $V_p$ to be obtained, thereby allowing electrical losses from the cell in the OFF state to be optimally limited.

Operation in ON State

When the transistor $T_1$ is in the OFF state (e.g. $V_{IN}=V_p+$Vss) (i.e. it no longer conducts current toward the load formed from the self-biasing circuit and the power transistor), the transistor $T_3$ is switched to the ON state. In this state it is equivalent, at its output, to a resistor $Rds_{3\_ON}$ connected between the gate ($g_2$) and the source ($s_2$) of the power transistor $T_2$, of very low value. The transistor $T_2$ is also in the ON state.

OFF→ON Switching

So that the transistor $T_2$ may rapidly switch from the OFF state to the ON state, it is necessary, at the moment when the transistor $T_2$ starts to switch, for the impedance presented at the input of $T_2$ to be low in order to favor rapid switching thereof. Stated otherwise, the transistor $T_3$, at its output, must be equivalent to a low-value resistor. This is the case when the transistor $T_3$ is in the on state. However, in the transient switching phase, $T_3$ also switches from the near-off state to the on state. It then presents a resistance to $T_2$ that varies from a high value to a low value. However, in practice, the transistor $T_3$ has a much smaller spread than $T_2$ as does not have to conduct large currents. Its input capacitance $c_{in3}$ is therefore much lower than the input capacitance $c_{in2}$ Of $T_2$ and thus it is able to switch very rapidly. Its equivalent output resistance therefore very rapidly equals its low resistance in the on state, thereby also allowing $T_2$ to switch very rapidly.

The switching time of the transistor $T_2$ from the OFF state to the ON state is given by the formula: $t_{ON \to OFF} = R_{eq(T3)} \cdot c_{in2}$, where $R_{eq(T3)}$ denotes the equivalent resistance of the transistor $T_3$ and is a mean value: when $T_3$ is in the OFF state, its equivalent resistance is high. When $T_3$ switches to the ON state, its equivalent resistance becomes increasingly low until reaching a value that is very low and, in practice, much lower than the optimum value of the resistor $R_2$ which is defined for the cell structure of the prior art (FIG. 1).

Thus, all of the effects favorably contribute to the same end.

It should be noted that the cell according to the invention requires no particular circuitry for managing temporal shifts in switching the various transistors, which would be difficult to achieve at the target switching speeds.

It should also be noted that the substantial current draw generated by the rapid charging of the input capacitance of $T_2$ passes between the drain and the source of $T_3$ and therefore determines its size: a transistor $T_3$ with too small a spread would not be able to deliver enough current and would lead to switching being slowed down. A transistor $T_3$ with too large a spread could allow current to pass in the transient phase, but would have too high an input capacitance and would therefore switch more slowly. In practice, in the proposed exemplary circuit, the transistor $T_3$ has a total gate spread that is eight times smaller than that of the transistor $T_2$. It is therefore capable of conducting eight times less current, but has an input capacitance that is eight times lower.

The cell of the invention therefore offers much higher efficiency and has many advantages.

This is apparent in the curves of FIGS. 7 to 12 that are obtained via simulation by using, for the common elements, the same simulation data as the cell of the prior art illustrated in FIG. 1. In particular, the signal $V_{IN}$ has a duty cycle of 50% at a chopping frequency of 100 MHz. The pinch-off voltage $V_p$ of the transistors is of the order of −3.5 volts. The transistor $T_3$ is chosen to be identical to the transistor $T_1$, and the resistor $R_3$ has a value of 35 ohms.

These simulations have been carried out for the case in which Vss is chosen to be zero (FIG. 7), or negative (FIGS. 8 to 12).

Figure 7:
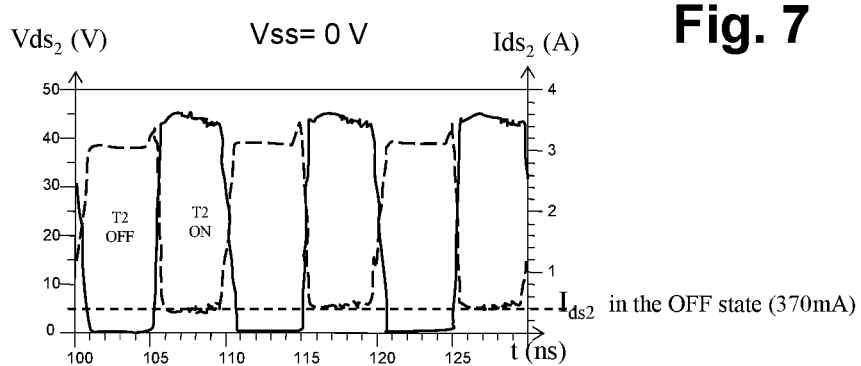
FIG. 7 shows the forms of the drain-source current and voltage of the power transistor that are obtained by simulating a cell according to the invention.
Figure 8:
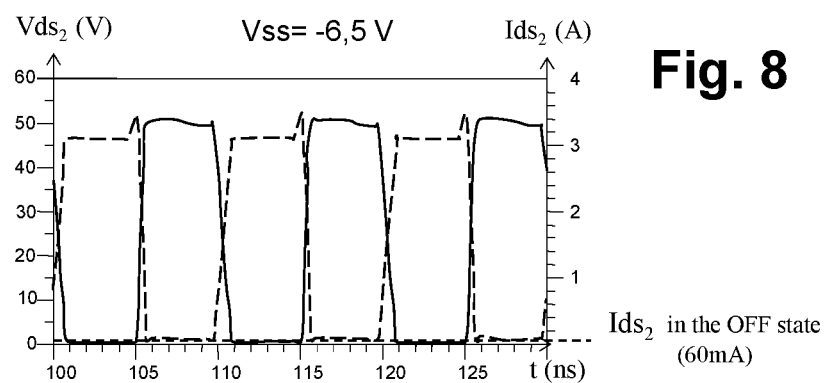
FIG. 8 shows the forms of the drain-source current and voltage of the power transistor that are obtained by simulating a cell according to an improved version of the invention.

The drain-source voltage Vds2 and current Ids2 curves of the transistor T2 of FIGS. 7 and 8 illustrate the case in which the reference voltage Vss is zero and the case in which it is negative, respectively.

Case in which Vss=0 V

FIG. 7 illustrates the simulation of the cell when the voltage Vss corresponds to the reference potential of the electrical ground (0 volts).

It shows that a drain-source current of the order of 370 milliamps and a switching time $t_{ON \to OFF}$ of less than 1 nanosecond is obtained in the OFF state of the transistor $T_2$. The drain-source voltage $V_{ds2}$ in the OFF state is of the order of 45 volts. The total efficiency calculated for this cell under the simulation conditions is thus 84%.

When the cell is in the OFF state, rather than having zero volts at the output Out of the cell, a non-zero voltage is found, due to $T_2$ not being completely pinched off (it is at the turn-off limit).

Case in which Vss is Negative

Figure 2:
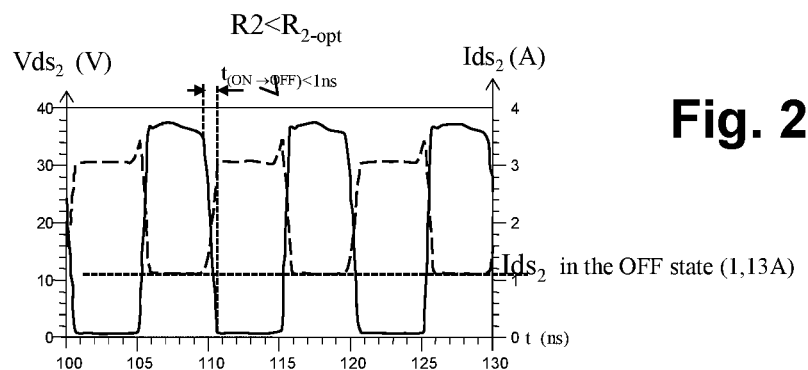
FIGS. 2, 3 and 4 show the drain-source current and voltage curves of the power transistor, obtained by simulating such a cell, for three values of the self-biasing resistor.
Figure 3:
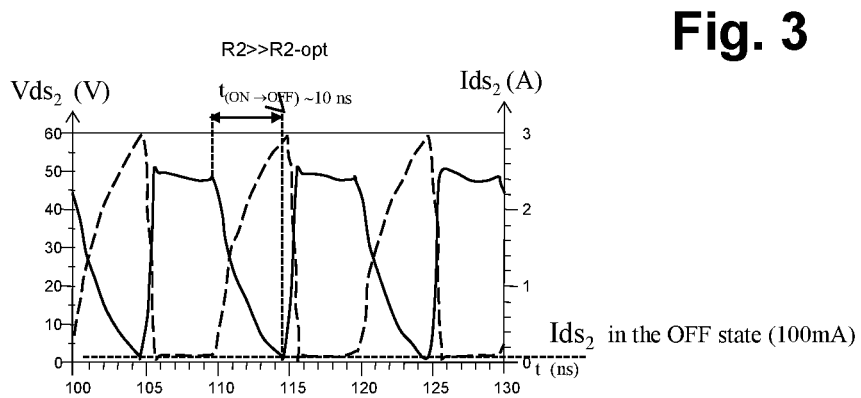
Figure 4:
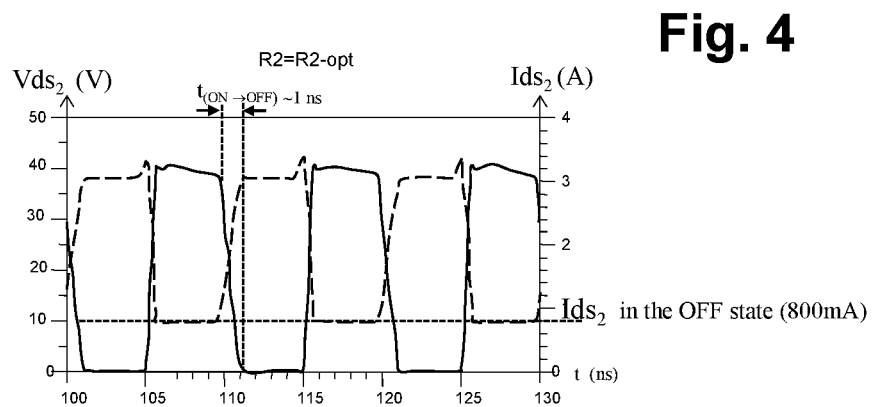

FIG. 8 illustrates the case in which the source $s_1$ of the input transistor is biased to a potential Vss that is more negative than electrical ground, to −6.5 volts in the example. As illustrated in FIG. 2, the voltage $V_{DD}$ switched at output is defined with respect to a ground at zero reference potential, GND. The input signal $V_{IN}$ is defined with respect to the reference potential Vss, so as to control switching to the ON state or OFF state, respectively, of the transistor $T_1$ in an appropriate manner.

In the example it varies between −5.5 volts (high level) and −10 volts (low level). The gate-source voltage of the transistor $T_1$ thus varies between +1 V, switching to an ON state, and −3.5 volts, switching to an OFF state.

By fixing Vss at a more negative potential, preferably in the vicinity of 2Vp (in the example Vp is of the order of −3.5 volts), then when the cell is in the OFF state Vss contributes to improving the pinch-off of $T_2$ in the OFF state, as is apparent from the equation EQ1 of $Vgs_{2\_OFF}$ given above. The electrical losses in the OFF state of the cell are thereby further decreased; the total efficiency of the cell is therefore improved.

This is indeed what FIG. 8 shows: the current $Ids_2$ in the OFF state is lower still than under the zero-Vss conditions of FIG. 7: it passes from 370 milliamps to about 60 milliamps. An efficiency of the cell that is equal to 90% is obtained, with an output power of 72 watts at the chopping frequency of 100 megahertz, which is very high performance and a marked improvement with respect to the efficiency of at best 77% obtained with the cell of the prior art (FIG. 1) for a comparable output power (75 watts).

In practice, fixing the bias voltage Vss of the source of the transistor $T_1$ at a zero voltage, or a more negative voltage, often close to 2Vp, may depend on the expected performance for a given application and/or the practical possibilities of having a negative reference voltage.

FIGS. 9 to 12 show the forms of the input and output currents and voltages of the cell according to the invention of FIG. 5, obtained under the same simulation conditions as the cell of the prior art but taking a reference voltage Vss that is equal to −6.5 volts.

They show various favourable operational aspects of the cell according to the invention, in particular:
obtaining a squarewave output voltage $V_{OUT}$ whose width and repetition are controlled by the input voltage $V_{IN}$ with switching edges that are faster than those of the input voltage, allowing the constraints on the generation or shaping of the input signal to be relaxed;
the change in state of the cell that is obtained for a very small variation, of the order of a few millivolts, in the input voltage $V_{IN}$ in the vicinity of a trigger threshold; high powers may thus be switched, many tens of watts in the example, at high frequency with minimal control energy, a few milliwatts in practice.

Figure 9:
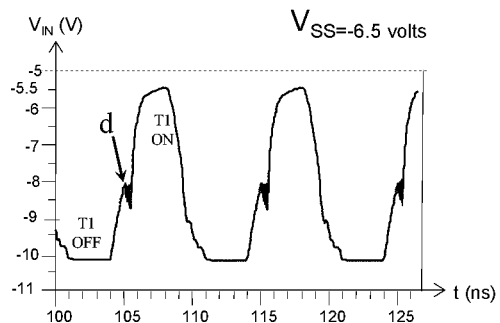
FIGS. 9 and 10 show the current and voltage curves at the input of a cell according to the invention.

FIG. 9 illustrates the input voltage curve $V_{IN}$ of the input signal applied to the gate $g_1$ of the transistor $T_1$. The input voltage $V_{IN}$ varies between a low level of −10 volts and a high level of −5.5 volts in order to make the transistor $T_1$ switch between the OFF and ON states, with a time of variation between these two levels of the order of 3 to 4 nanoseconds. The voltage $Vgs_1$ of the transistor $T_1$ thus varies between −3.5 volts and +1 volts.

Figure 10:
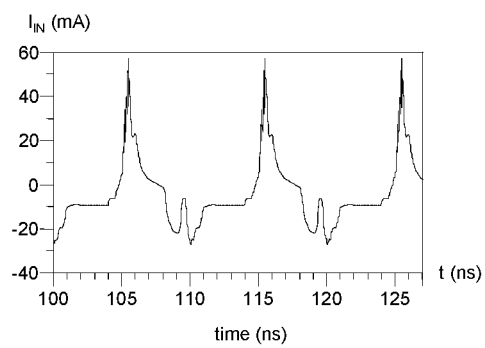

FIG. 10 shows the input current curve $I_{IN}$ in the input capacitance of the transistor $T_1$. It shows the current draw in the input capacitance of the transistor $T_1$ when it starts to switch from the OFF state to the ON state, at the instant marked by the reference d in FIG. 9, causing the change in state of the cell from ON to OFF.

Figure 11:
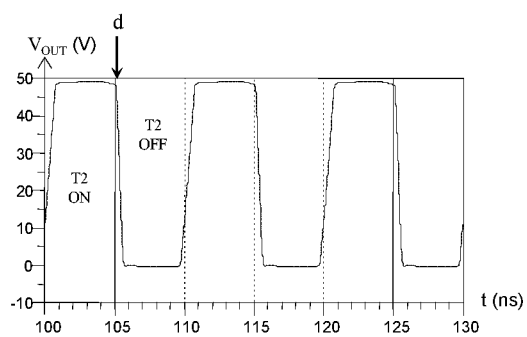
FIGS. 11 and 12 show the corresponding voltage $V_{out}(t)$ and current $I_{out}(t)$ curves at the output $P_{out}$ of a cell according to the invention.

FIG. 11 shows the voltage $V_{OUT}$ at the output node of the cell. Stated otherwise, it is the voltage measured across the source $s_2$ of the power transistor $T_2$: it takes a squarewave form, varying between a level close to $V_{DD}$, when the power transistor $T_2$ is in the ON state (equivalent to a short circuit); and close to zero volts when the power transistor $T_2$ is in the OFF state. The switching edges are fast, of the order of 1 to 2 nanoseconds or even less than a nanosecond: the variations in the output signal are faster than those of the input signal $V_{IN}$.

Figure 12:
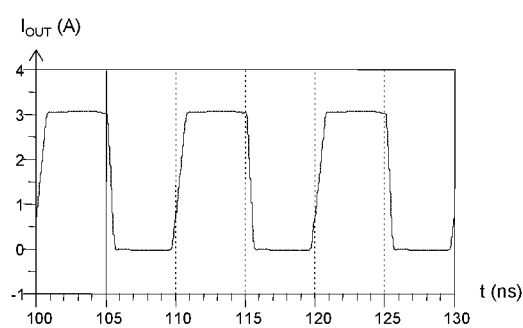

FIG. 12 shows the output current $I_{OUT}$ drawn by the load (recall that the load is purely resistive in the example of the simulation); this current takes the form of a squarewave that follows the output voltage.

Thus, the cell according to the invention is more efficient and has numerous advantages with respect to the cell according to the prior art.

Its operation may still be adjusted by adding resistors to certain connections of the cell with a view to making these connections more resistive. These (optional) resistors allow fine adjustments to be made in practice, with a view to improving the efficiency of the cell according to the operating conditions of use. These resistors mainly improve the stability margin of the transistors and limit the effects of overvoltages or bounces caused by parasitic inductances of the structure, which are detrimental to efficiency.

Figure 6:
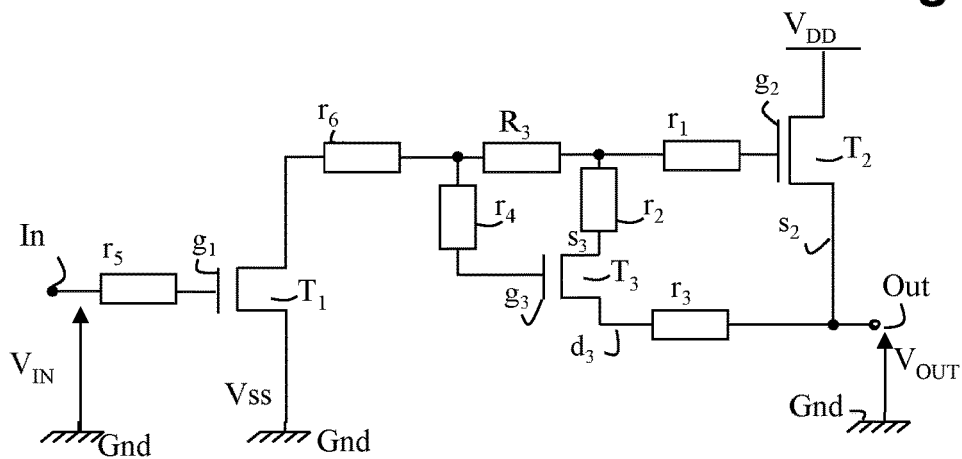
FIG. 6 illustrates possible ways to stabilize the response of the cell by adding additional resistors to the structure of FIG. 2.

FIG. 6 thus shows various resistors that could be added to the cell structure according to the invention. In particular:
the connection between the gate $g_2$ of the power transistor $T_2$ and the self-biasing resistor $R_3$ may comprise a resistor $r_1$;
the connection between the self-biasing resistor $R_3$ and the source $s_3$ of the transistor $T_3$ may comprise a resistor $r_2$;
the connection between the drain $d_3$ of the second transistor $T_3$ and the source $s_2$ of the power transistor $T_2$ may comprise a resistor $r_3$;
the connection between the self-biasing resistor $R_3$ and the gate $g_3$ of the second transistor $T_3$ may comprise a resistor $r_4$ connected between this gate $g_3$ and the resistor $R_3$;
the connection between the input port In and the gate $g_1$ of the input transistor $T_1$ ($g_1$ control input of the current switch $T_1$) may comprise a resistor $r_5$.
the connection between the drain $d_1$ of the input transistor $T_1$ and the resistor $R_3$ may comprise a resistor $r_6$;
The value of each of these resistors $r_1$ to $r_6$ is determined in practice by simulating the operating conditions for a given application. Depending on the case, at the end of the simulation zero, one, multiple or all of these resistors will be determined to have a non-zero value.

Figure 13:
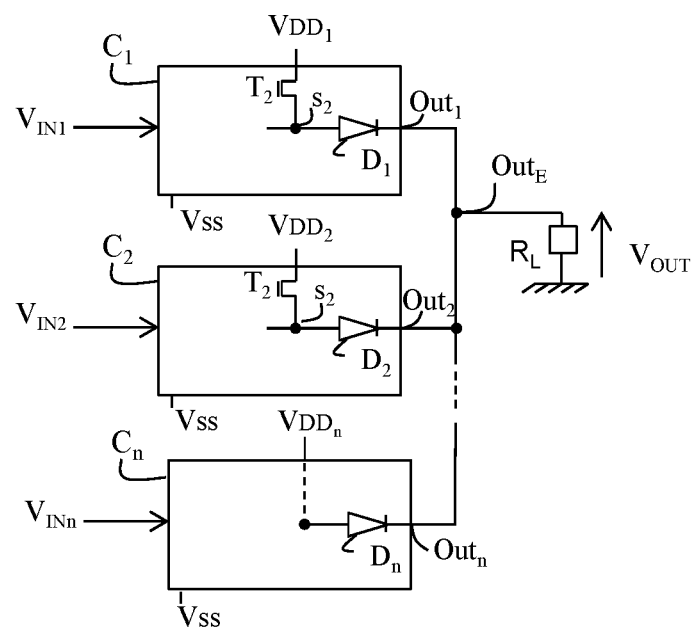
FIG. 13 illustrates an application of the cell according to the invention in an electronic device using multiple power switching cells in parallel.

The switching cell described above may be used alone or with other cells of the same type. FIG. 13 thus illustrates the case of an electronic device in which multiple cells according to the invention are used in parallel, with their output ports all connected to a common output port. Each cell then additionally comprises a protection diode at the output.

In the example illustrated, an electronic device thus comprises n cells in parallel, $C_1, C_2, \ldots C_n$. Each cell $C_i$ is controlled by a control signal $V_{IN_i}$ specific thereto in order to switch a different voltage $V_{DD_i}$, where the index i is equal to 1, ... n.

The n cells are connected at output to one and the same output node $Out_E$ which is connected to a load embodied in this instance by a resistor $R_L$. The protection diode $D_i$ of each cell $C_i$ is connected between an output node $Out_i$ of the cell (corresponding to the source $s_2$ of the power transistor $T_2$ of the cell) and the output node of the device, $Out_E$.

In such an assembly, if just one of the cells out of the n cells is in the ON state, for example $C_2$, and all of the other cells are in the OFF state, it is the voltage $V_{DD_2}$ switched by the cell in the ON state that is across the output node $Out_E$: $Vout_E = V_{DD_2}$.

As all of the other cells are in the OFF state, the voltage across the output node of these cells is zero or close thereto (close to $-Vp$): the protection diode of each of these "OFF" cells is therefore reverse biased, each having a negative voltage that is substantially equal to $-V_{DD_2}$ across their terminals.

If two (or more) cells are now on, for example the cells $C_2$ and $C_n$, where $V_{DD_2} > V_{DD_n}$, then as output it is still the highest voltage, $V_{DD_2}$ in the example, that is at the output, and the protection diode $D_n$ of the cell $C_n$ is reverse biased (its voltage is $V_{DD_n} - V_{DD_2} < 0$).

This example illustrates that if the cell associated with the lowest voltage to be switched, $V_{DD_n}$ in the example, is in the ON state, the voltage across the output node of the device will be equal to $V_{DD_n}$ only if no other cell is in the ON state.

In a variant, provision may be made for this cell $C_n$ that receives the lowest positive supply voltage to be switched $V_{DD_n}$ to be formed by the single protection diode. This protection diode will then be directly connected between the positive supply voltage to be switched and the output of the cell.

The cell $C_n$ may essentially consist of the protection diode $D_n$ which will then be directly connected between the voltage $V_{DD_n}$ and the output node of the device. The diode Dn will then be on only if all of the other cells $C_1$ to $C_{n-1}$ are in the OFF state.

As the cells are capable of switching high voltages, this assembly of n cells (or variant thereof) allows, for example, a digital-analog power converter as described in detail in the aforementioned application WO2012/072503 to be produced using simple logic.

The invention described above thus proposes an especially efficient power switching cell with non-isolated control and a structure that remains compact and inexpensive: there is no complex signal shaping circuitry nor any switching time shift management; the additional transistor $T_3$ is not a transistor having to switch power; the switching of the transistor $T_3$, used as a variable resistor for the power transistor and the power transistor $T_2$, is ensured using a current switch controlled by the input signal of the cell. This switch may be a transistor, as illustrated, and may be associated with an adjustable current source.

This cell may be used alone or in multiple in numerous high-frequency power switching applications, but also, and a fortiori, for lower frequency applications.

The invention claimed is:

1. A power switching cell comprising:
   an input port capable of receiving a switching control signal which is referenced to a general ground of the cell, constituting a non-isolated control of the cell;
   a normally on field-effect power transistor having a drain capable of receiving a positive supply voltage that is defined with respect to a ground at zero reference potential in order to apply it to an output port, and a source connected to the output port;
   a self-biasing circuit for biasing a gate of the power transistor; and
   a current switch electrically connected between the self-biasing circuit and a negative or zero reference potential, a switching control input of which is connected to the input port, and configured so that, on activation by said switching control signal, said current switch electrically connects the negative or zero reference potential to the self-biasing circuit,
   wherein the self-biasing circuit comprises:
      a normally on field-effect transistor having a drain connected to the source of the power transistor and a source connected to the gate of the power transistor;
      a self-biasing resistor for biasing a gate of the transistor of the self-biasing circuit, which resistor is connected between the gate and the source of said self-biasing transistor; and in series between the current switch and the source of said self-biasing transistor.

2. The switching cell as claimed in claim 1, comprising an adjustable current source connected in series between said current switch and the negative or zero reference voltage.

3. The switching cell as claimed in claim 1 wherein the current switch comprises at least one field-effect transistor that is electrically connected between the self-biasing circuit and the negative or zero reference potential.

4. The switching cell as claimed in claim 3, wherein the current switch uses one or more normally on field-effect transistor(s).

5. The switching cell as claimed in claim 1, wherein activation of the current switch by the input signal switches the self-biasing transistor and the power transistor to an OFF state, that is at a turn-off limit, of the self-biasing transistor and the power transistor and deactivation of the current switch switches the self-biasing transistor and the power transistor to an ON state.

6. The switching cell as claimed in claim 1, wherein at least one of the connections in the following list comprises an additional resistor a connection between the gate of the power transistor and the self-biasing resistor; a connection between the drain of the self-biasing transistor and the source of the power transistor; a connection between the gate of the self-biasing transistor and the self-biasing resistor; a connection between the self-biasing resistor and the source of the self-biasing transistor; a connection between the control input of the current switch and the input port is resistive; a connection between the current switch and the self-biasing resistor.

7. The switching cell as claimed in claim 1, wherein the self-biasing transistor and the power transistor are HEMT field-effect transistors.

8. The switching cell as claimed in claim 7, wherein the HEMT field-effect transistors are produced using a technology chosen from the following list: GaN, GaAs.

9. An electronic device comprising n power switching cells as claimed in claim 1, the n cells being arranged in parallel, n being an integer that is greater than 1, with their output ports connected to a shared output port of the device, wherein each cell comprises a single protection diode arranged in series between the source of the power switching transistor of the cell and the shared output port.

10. The electronic device as claimed in claim 9, wherein each cell receives a respective positive supply voltage as output, wherein the cell that receives the lowest positive supply voltage is formed by the single protection diode that is directly connected between the positive supply voltage to be switched and the output of the cell.

* * * * *